United States Patent [19]

Carter

[11] Patent Number: 4,758,985

[45] Date of Patent: Jul. 19, 1988

[54] MICROPROCESSOR ORIENTED CONFIGURABLE LOGIC ELEMENT

[75] Inventor: William S. Carter, Santa Clara, Calif.

[73] Assignee: Xilinx, Inc., San Jose, Calif.

[21] Appl. No.: 845,287

[22] Filed: Mar. 28, 1986

Related U.S. Application Data

[63] Continuation-in-part of Ser. No. 706,429, Feb. 27, 1985, Pat. No. 4,706,216.

[51] Int. Cl.⁴ .............................................. G11C 13/00
[52] U.S. Cl. ..................................... 365/94; 365/103; 365/154
[58] Field of Search ................. 365/94, 103, 154, 189, 365/230

[56] References Cited

U.S. PATENT DOCUMENTS 3,967,251  6/1976  Levin ..................................... 365/94

Primary Examiner—Terrell W. Fears
Attorney, Agent, or Firm—Alan H. MacPherson; Edel M. Young; Terrence E. Dooher

[57] ABSTRACT

A microprocessor controlled configurable logic circuit achieves versatility by including a configurable combinational logic element, a configurable storage circuit, a configurable status buffer, and a configurable output select logic. The input signals to the configurable combinational logic element are input signals to the configurable logic circuit and feedback signals from the storage circuit. The storage circuit may be configured to operate as a D flip-flop with or without set and reset inputs, or as an edge detector. In conjunction with the combinational logic element, the storage circuit may also operate as a stage of a shift register or counter. The output select logic selects output from among the output signals of the combinational logic element and the storage circuit. The configurable status buffer may be configured to provide status information on selected important internal signals of the configurable logic circuit. A microprocessor interface structure may access an array of these configurable logic circuits through the status buffer to read different internal output signals from different circuits in the array. Providing separate input and output to a microprocessor leaves the storage element free for other uses and does not require the logic provided by the logic elements.

11 Claims, 14 Drawing Sheets

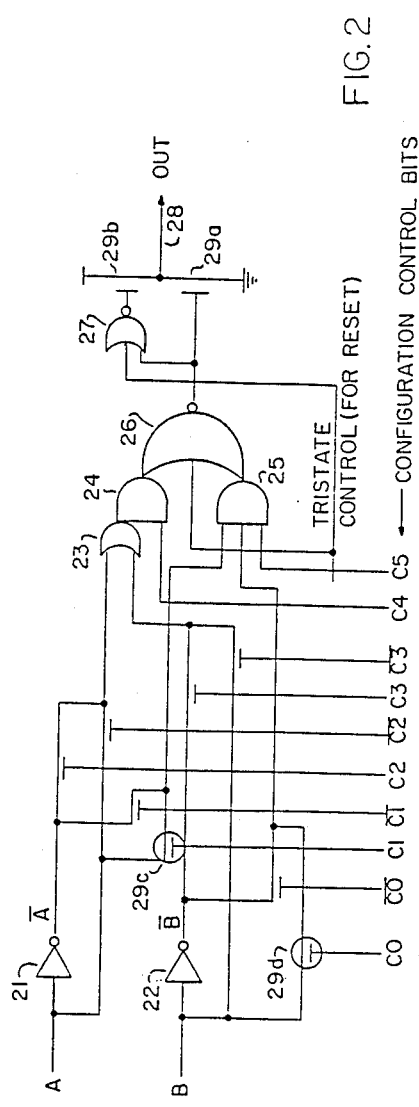
FIG. 2
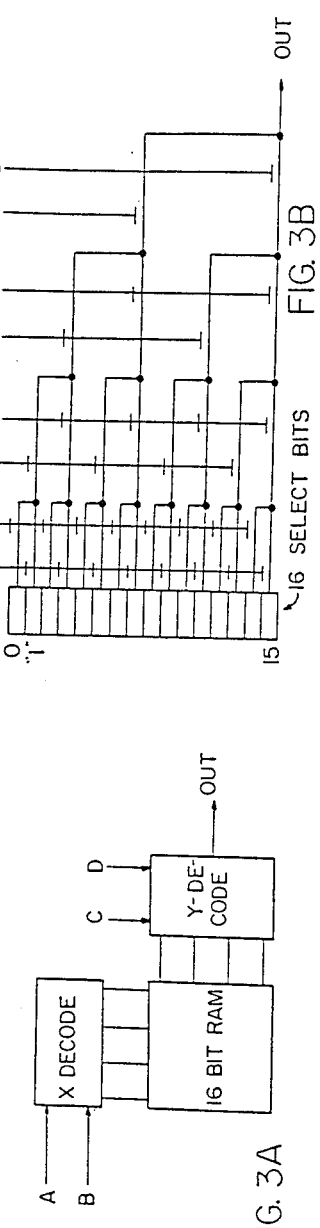
FIG. 3B
FIG. 3A

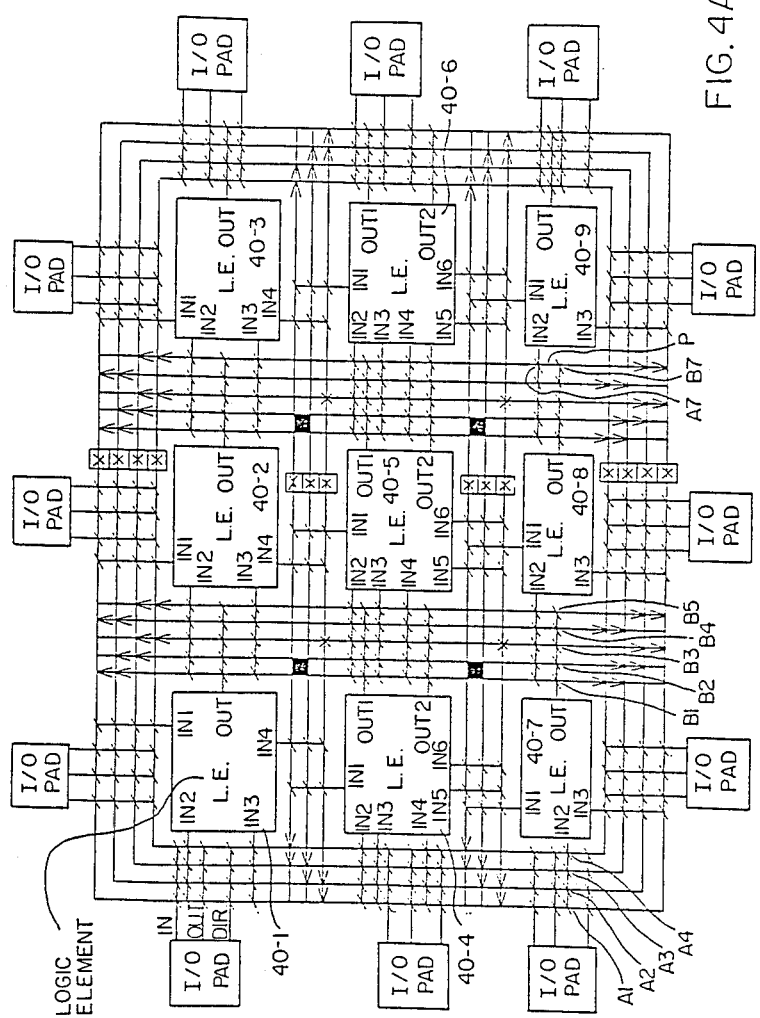

─┼─ = ─┼─ (i.e., Crossover without Connection or Possibility of Connection)

─┼─ = ─┼─ or ─┼─ (i.e., Can Only be Connected or Disconnected, As Input or Output, But Cannot be Broken)

╪ = Full Interchange

✴ = Full Interchange

✴ = Partial Interchange: ┴ ┴ ┴ ┴ ┴

Lines (4 Vertical Shown) that do not have ╪ ✴ = Intersections are Intended to be Low Skew (i.e., Clock or Other) Paths.

▭ = Directional Amplifier (Direction is Selectable) to Prevent Signal Drooping Through too Many Pass Devices.

FIG 4B

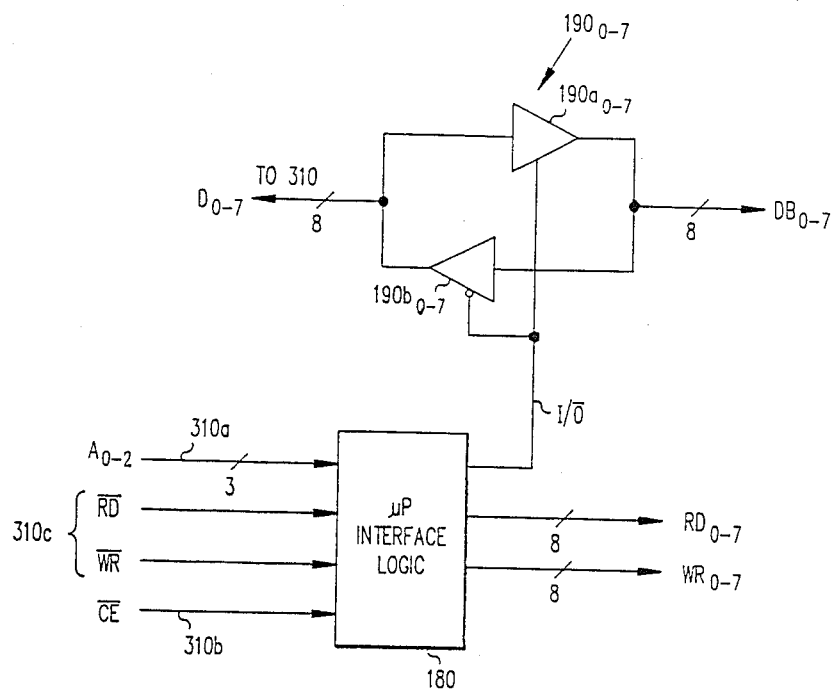
CLA MICROPROCESSOR INTERFACE LOGIC    FIG. 12
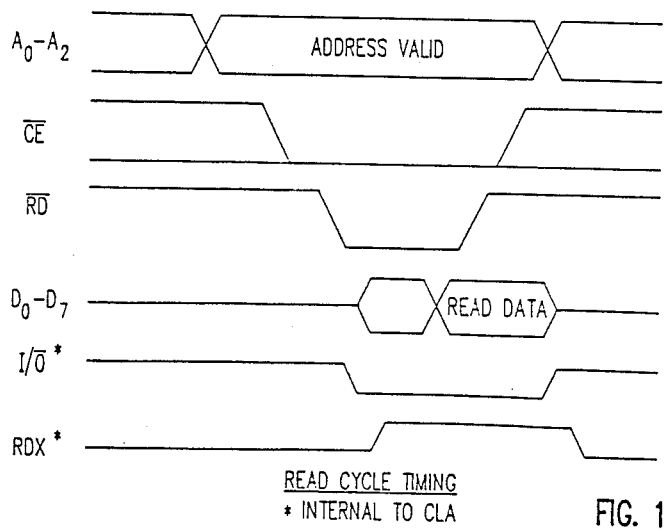
READ CYCLE TIMING
* INTERNAL TO CLA    FIG. 13

WRITE CYCLE TIMING
* INTERNAL TO CLA

MICROPROCESSOR ORIENTED CONFIGURABLE LOGIC ELEMENT

This application is a continuation in part of U.S. patent application Ser. No. 706,429, filed, Feb. 27, 1985, now U.S. Pat. No. 4,706,216, issued 11-10-87 which is incorporated herein by reference.

FIELD OF THE INVENTION

This invention relates to a configurable logic element in general and in particular, to a configurable logic element which is composed of a configurable combinational logic element, a configurable storage element and a configurable output select logic. The output signals of the configurable storage element serve as input signals to both the configurable combinational logic and the output select logic. The output signals of the output select logic are selected from the output signals of the combinational logic element and the output signals of the storage element. A microprocessor oriented configurable logic element is disclosed which includes additional circuitry which allows easy interface to a microprocessor without utilizing the other resources of the configurable logic element. In particular a microprocessor oriented configurable logic element is disclosed which includes a second storage circuit for storing data written from a microprocessor and for providing a signal representing the stored data to the combinational logic element, and means for allowing a microprocessor to read the status of selected ones of the output signals of the combinational logic element, the configurable storage element, and the storage circuit.

BACKGROUND OF THE INVENTION

In copending patent application Ser. No. 06/588,478, filed Mar. 12, 1984 by Ross H. Freeman and entitled "CONFIGURABLE LOGIC ARRAY" which is incorporated herein by reference, a structure is described which allows changing the configuration of a finished integrated circuit from time to time (even when the integrated circuit is installed in a system) to provide any one of a plurality of logical functions from the same integrated circuit. This is accomplished by providing a number of "configurable logical elements" (herein referred to as "configurable logic elements") each of which is capable of being configured to implement any one of a plurality of logic functions depending on the task which it is called upon to perform. By configurable logic element (CLE) is meant a combination of devices which are capable of being electrically interconnected by switches operated in response to control bits stored on the chip (or transmitted to the chip) to perform any one of a plurality of logical functions. The configurable logic element disclosed in application Ser. No. 06/588,478 may include all of the circuit elements necessary to provide one or more of the functions provided by, for example, an AND gate, flip-flop, inverter, NOR gate, exclusive OR gate, and combinations of these functions to form more complex functions. The particular function to be carried out by a configurable logic element is determined by control signals applied to the configurable logic element from control logic. Depending on the control signals, a configurable logic element can function as an AND gate, an OR gate, a NOR gate, a NAND gate, or an exclusive OR gate or any one of a number of other logic functions without change in physical structure. Structure is provided on chip to allow any one of a plurality of functions to be implemented by the configurable logic element. This is done by providing control logic to store and generate control signals which control the configuration of the configurable logic element.

In one embodiment, the control signals are stored and transmitted by control logic formed integrally with and as part of the integrated circuit chip containing the configurable logic elements. However, if desired, the control information can be stored and/or generated outside the integrated circuit and transmitted through pins to the configurable logic element.

In general, a given set of control signals in the form of control bits is transmitted from the control logic to a configurable logic element to control the configuration of that configurable logic element. The actual set of control bits provided to the configurable logic element on the integrated circuit chip depends on the function to be carried out by the configurable logic element on the chip.

In copending U.S. application Ser. No. 706,429, filed Feb. 27, 1985, on an invention of William S. Carter, a particularly versatile configurable logic element is described which includes a configurable combinational logic element, a configurable storage element and a configurable output select logic. The output signals of the configurable storage element serve as input signals to both the configurable combinational logic and the output select logic. This configurable logic element, however, is not well suited to easy communication with a microprocessor since, for example, if a data signal from a microprocessor is stored in the configurable storage element, the configurable storage element is then not available to receive other output signals from the configurable combinational logic element. Moreover, communication between an array of such configurable logic elements and a microprocessor would require use of the general interconnect structure of the configurable logic array, reducing the versatility of the array.

SUMMARY OF THE INVENTION

A microprocessor oriented configurable logic element is disclosed which includes the great versatility, in the selection of the functions it is capable of implementing, of the configurable logic element described in U.S. Pat. Application Ser. No. 706,429. The microprocessor oriented configurable logic element includes a combinational logic element, a first storage element, and an output select logic, each of which is configured by control bits. Selected input signals to the configurable logic element together with selected "feedback" signals from the storage element are the input signals to the combinational logic element. The input signals to the configurable logic element together with the output signals of the combinational logic element provide input signals to the configurable storage element. The output select logic provides output signals which are selected from the output signals of the combinational logic element and the storage element.

The microprocessor oriented configurable logic element includes additional circuitry which allows easy interface to a microprocessor without utilizing the other resources of the configurable logic element. In particular, the microprocessor oriented configurable logic element also includes a bidirectional data bus and a second storage circuit for storing a data signal written by a microprocessor and for providing the stored signal to the combinational logic element and means for allowing the microprocessor to read the status of selected ones of the output signal of the combinational logic element, the configurable storage element, and the second storage circuit.

This invention will be more fully understood with reference to the following detailed description and accompanying drawings.

DESCRIPTION OF THE DRAWINGS

FIG. 2 illustrates the internal logic structure of one possible configurable logic element capable of implementing a number of useful functions of two variables A and B;

FIG. 3A illustrates a 16 bit RAM circuit wherein any one of sixteen possible input states is capable of being identified and $2^{16}$ functions are capable of being implemented;

FIG. 3B illustrates a selection structure for selecting any one of sixteen bits capable of implementing $2^{16}$ functions, for transmittal to an output lead;

FIG. 4A illustrates a plurality of configurable logic elements (shown as nine logic elements) formed on an integrated circuit chip together with programmable interconnects formed between selected leads to yield desired logic functions and with selected input/output pads and interconnections of the leads between logic elements;

FIG. 4B shows the key to the cross connections between crossing conductive leads in FIG. 4B;

FIG. 12 shows a schematic diagram of CLA microprocessor interface logic 180 shown in FIG. 11.

FIG. 13 shows read cycle timing for circuit 300 shown in FIG. 11.

DETAILED DESCRIPTION

The following detailed decription of this invention is meant to be illustrative only and not limiting. Other embodiments of this invention will be obvious to those skilled in the art in view of the following disclosure.

Copending U.S. application No. 588,478, filed Mar. 12, 1984, on an invention of Ross H. Freeman entitled "Configurable Logic Array" is incorporated herein by reference.

It is necessary to explain the configurable logic elements and general interconnect structure of the configurable logic array described in the above copending application in order to explain the particular configurable logic element of the present invention.

Figure 1:
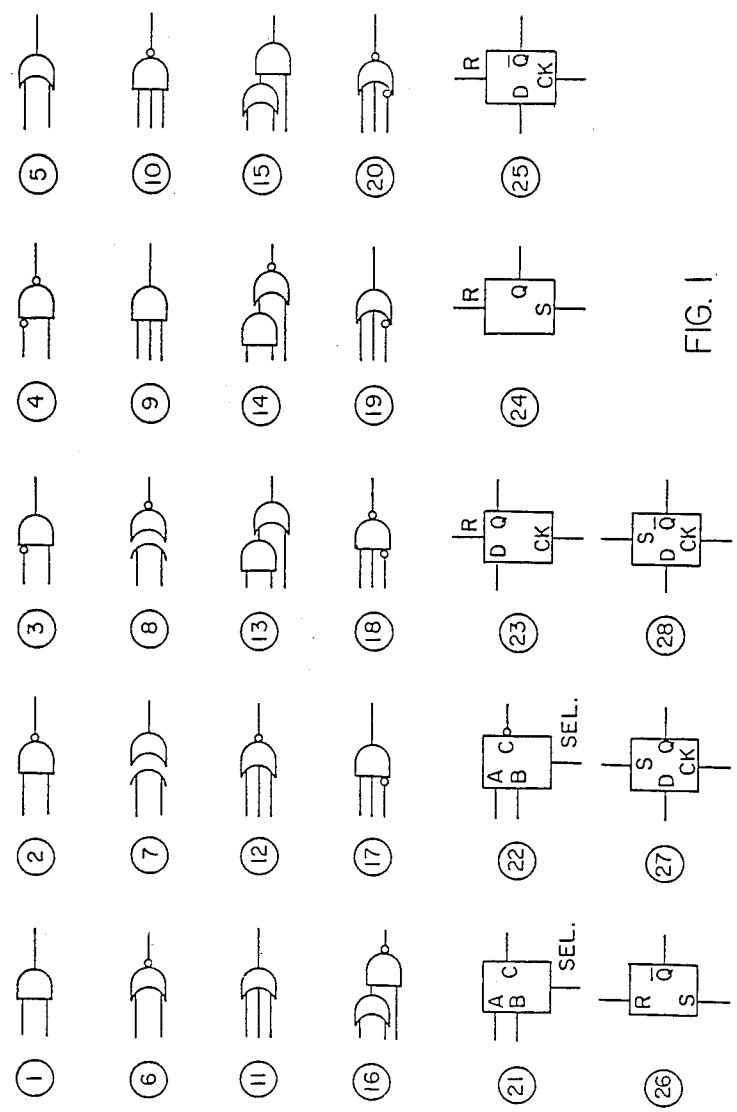
FIG. 1 illustrates some of the various logic functions capable of being implemented by a configurable logic element in a configurable logic array.

FIG. 1 illustrates certain logic functions capable of being implemented by a configurable logic element. The 28 functions shown in FIG. 1 are merely illustrative and other elements not shown can, if desired, be implemented by a configurable logic element. The following functions are shown:

| Element | Function |
|---|---|
| 1 | AND gate |
| 2 | NAND gate |
| 3 | AND gate with inverted input |
| 4 | NAND gate with inverted input |
| 5 | OR gate |
| 6 | NOR gate |
| 7 | exclusive OR gate |
| 8 | exclusive NOR gate |
| 9 | 3 input AND gate |
| 10 | 3 input NAND gate |
| 11 | 3 input OR gate |
| 12 | 3 input NOR gate |
| 13 | OR gate with one input comprising AND gate |
| 14 | NOR gate with one input comprising AND gate |
| 15 | AND gate with one input comprising OR gate |
| 16 | NAND gate with one input comprising OR gate |
| 17 | 3 input AND gate with one input inverted |
| 18 | 3 input NAND gate with one inverted input |
| 19 | 3 input OR gate with one inverted input |
| 20 | 3 lead NOR gate with one inverted input |
| 21 | one of two inputs multiplexer |
| 22 | inverting one of two inputs multiplexer |
| 23 | "D" flip flop reset |
| 24 | Set-Reset latch |
| 25 | "D" flip-flop with reset and inverted output |
| 26 | Set-reset latch with reset and inverted output |
| 27 | "D" flip-flop with set |
| 28 | "D" flip-flop with set and inverted output | of course, other logic functions can also be implemented in a configurable logic element.

FIG. 2 illustrates the internal logic structure of one possible configurable logic element which is capable of implementing all useful basic functions of the two variables A and B, with the functions being selected by configuration control signals C0, $\overline{C0}$C1, $\overline{C1}$, ... through C5 on control leads C0, $\overline{C0}$, ... through C5. (In this example, all control leads are connected to the gates of N channel enhancement mode pass transistors.) To implement an AND gate function using the structure shown in FIG. 2, the input leads labeled A and B are shunted past inverters 21 and 22, respectively, to AND gate 25 by high level signals on the C1 and C0 configuration control leads which, being connected to the gates of N channel enhancement mode pass transistors 29c and 29d, cause pass transistors 29c and 29d to turn on.

Low level signals are applied to the configuration control leads $\overline{C0}$ and $\overline{C1}$, thus blocking the output signals of inverters 21 and 22 from AND gate 25. In addition, a high level signal on lead C5 is applied to enable AND gate 25. Thus three input AND gate 25 functions as a two-input AND gate with respect to the signals A and B. The output signal of AND gate 25 provides one input signal to NOR gate 26. A second input signal to NOR gate 26 is provided by the output signal of AND gate 24. The output signal of AND gate 24 is held at a logical 0 by applying a logical 0 to configuration control lead C4. Thus the control signals C2 and C3 are "don't cares", that is, these signals can be high or low without affecting the output signal of AND gate 24. Since the output signal of AND gate 24 is a logical 0, and since the tristate control input signal to NOR gate 26 is a logical 0, it is easy to see that AND gate 25, AND gate 24 and NOR gate 26 function together as a NAND gate with respect to input signals A and B. Since the three-state control signal input to NOR gate 27 is a logical 0 (except during reset), NOR gate 27 serves as an inverter with respect to the output signal of NOR gate 26. The output signal of NOR gate 26 is applied to the gate of N channel transistor 29a (the source of which is grounded and the drain of which is connected to output lead 28) and the complement of the output signal of NOR gate 26 is applied to the gate of N channel transistor 29b (the source of which is connected to a power supply and the drain of which is connected to both the output lead 28 and the drain of N channel transistor 29a). Thus, transistors 29a and 29b function as an inverter with respect to the output signal of NOR gate 26. Thus, the structure of FIG. 2 configured as described above performs the function of an AND gate with respect to the signals A and B. Other logic functions can also be produced by appropriate selection of the control signals to be supplied to the configuration control leads C0 through C5 to activate the appropriate pass transistors and gates within the structure.

Figures 3C, 3D:
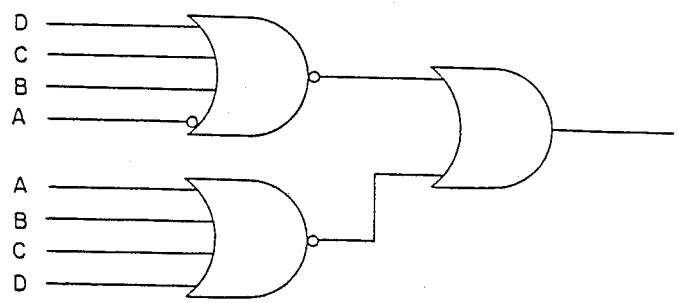
FIG. 3C illustrates one possible Karnaugh map for the structure of FIG. 3A.
FIG. 3D illustrates the logic gates represented by placing a binary one in the Karnaugh map of FIG. 3C at the intersections of the first and second rows and the first column.

FIG. 3A illustrates a 16 bit RAM capable of producing an output signal in response to any one of sixteen possible combinations of input signals. Thus input signals A and B control the X decoder to select any one of the four columns in the 16 bit RAM. Input signals C and D control the Y decoder to select any one of the four rows in the 16 bit RAM. The 16 bit RAM produces an output signal representative of the bit at the intersection of the selected row and column. There are 16 such intersections and thus sixteen such bits. There are $2^{16}$ possible combinations of functions capable of being represented by 16 bits. Thus, if a NOR gate is to be simulated by the 16 bits in the RAM, the Karnough map for the RAM would be as shown in FIG. 3C. In FIG. 3C all bits are "0" except the bit at the intersection of the first row (representing A=0, B=0) and the first column (representing C=0, D=0). Should a less frequently used function be desired to be generated by the 16 bit RAM, (for example, should a "1" output signal be desired for A=1, B=0, C=0 and D=0) then a binary "1" is stored at the intersection of the second row and the first column. Should a binary "1" be desired both when A=0, B=0, C=0 and D=0 and also when A=1, B=0, C=0 and D=0, then a binary "1" is stored at each of the intersections of the first column with the first row and the second row. The logic circuit represented by this loading of the RAM is as shown in FIG. 3D. Thus the RAM of FIG. 3A represents an elegant and simple implementation of any one of $2^{16}$ logic functions.

FIG. 3B shows another structure for yielding any one of sixteen select bits. Each of registers 0-15 in the vertical column to the left labeled "16 Select Bits", contains a selected signal, either a binary 1 or 0. By selecting the proper combination of A, B, C, and D, a particular bit stored in a particular one of the sixteen locations in the 16 Select Bits register is transmitted to the output lead. Thus, for example, to transmit the bit in the "1" register to the output lead, the signal A, $\overline{B}$, $\overline{AC}$, and $\overline{D}$ is applied to the leads so labeled. To transmit the signal labeled "15" in the sixteenth location in the 16 Select Bits register to the output lead, the signal A, $\overline{B}$, $\overline{C}$, and $\overline{D}$ is applied to the appropriate columns. Again, any one of $2^{16}$ logic functions can be implemented using this structure.

FIGS. 4A illustrates a configurable logic array (CLA) containing nine configurable logical elements. As shown in FIG. 4A, each CLE of the nine CLEs 40-1 through 40-9 has a plurality of input leads and one or more output leads. Each input lead has a plurality of access junctions each connecting a selected general interconnect lead to the input lead. The access junctions for input lead 2 of CLE 40-7 are labeled A1 through A4 in FIG. 4A. The access junctions form the other input leads are indicated schematically but are not labeled for the sake of clarity. Similarly, each output lead of each CLE has a plurality of access junctions each connecting the output lead to a corresponding one of the general interconnect leads. The access junctions are indicated schematically for each output lead of each CLE in FIG. 4A. The access junctions for the output lead of CLE 40-7 are labeled B1 through B5. The leads in FIG. 4A which are neither input leads nor output leads are called general interconnect leads and the junctions in FIG. 4A which are not access junctions for input and output leads are called general interconnect junctions. As shown in FIG. 4A, nine logic elements are placed on an integrated circuit chip together with programmable access junctions and a general interconnect structure which comprises general interconnect leads and programmable general interconnect junctions for connecting various leads to other leads. The general interconnect structure includes a set of general interconnect leads and of programmable junctions interconnecting the general interconnect leads having the property that for each general interconnect lead in the general interconnect structure there is a programming of the general interconnect junctions which connects the given general interconnect lead to one or more other leads in the general interconnect structure. Moreover, there is a programming of the junctions (both access and general interconnect) such that for any given output lead of any CLE in the CLA, and for any given input lead of any other CLE in the CLA, there is a programming of the junctions such that the given output lead is connected to the given input lead. An electrical path from a given output lead to a given input lead always contains at least two access junctions and at least a portion of a general interconnect lead. For example, one electrical path from the output lead of CLE 40-8 to the second input lead of CLE 40-9 contains access junctions A7 and B7 and the marked portion P of a general interconnect lead. Typically, an electrical path from an output lead of one CLE to an input lead of another CLE will also contain one or more general interconnect junctions. Each of logic elements 40-1 through 40-9 represents a collection of circuitry such as that shown in FIG. 2 or some similar structure capable of being configured as described above in FIG. 2 to perform any one of a number of logic functions. To program the circuitry (both the configurable interconnect switches and the configurable logic elements), selected signals are applied to input leads identified as configuration control input leads thereby to generate a desired logical function in each of the logic elements and to interconnect the logic elements as desired. In FIG. 4A, no specific lead has been identified as an input lead for the configuration control signals. However, any particular I/O pad can be selected for this purpose. The configuration control bits can be input into the configurable logic array either in series or in parallel depending upon design considerations where they are typically stored in a programming register (shown in FIG. 5). Alternatively, the configuration control bits may be stored in a memory on chip. In addition, another I/O pad will be used for an input clock signal which is used, inter alia, for the loading of the configuration control signals into the programming register. When the configurable logic array shown in FIG. 4A has been configured, selected output signals of logic elements 40-1 through 40-9 are provided to selected I/0 pads. FIG. 4B illustrates the meaning of the junction symbols used in FIG. 4A.

The configurable logic array described above is relatively inefficient in use of chip area compared to a hard wired circuit that performs the same function. The advantage of this circuitry, however, is that it allows the user to program and, if necessary, reprogram the circuit. Only one kind of chip need be kept in inventory. If mistakes in programming are discovered, the user can reprogram his chips relatively easily (in the prior art the parts are thrown away after being incorrectly programmed and new ones programmed). Long manufacturing cycles required where the manufacturer programmed the products are avoided. Here the chip is manufactured as a standard product which later can be configured to the user's specifications.

Figure 5:
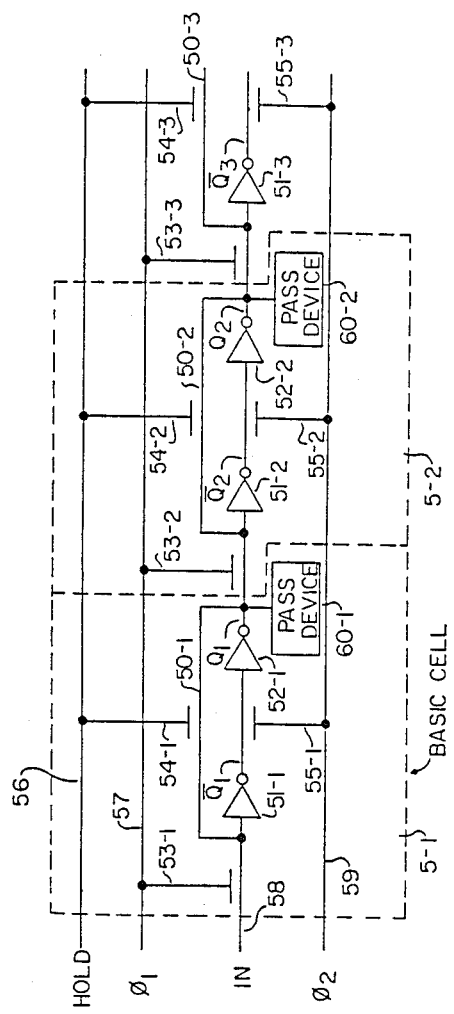
FIG. 5 represents a portion of the circuitry of a novel combination static and dynamic shift register appropriate for use with the microprocessor oriented configurable logic array of this invention.
Figure 6:
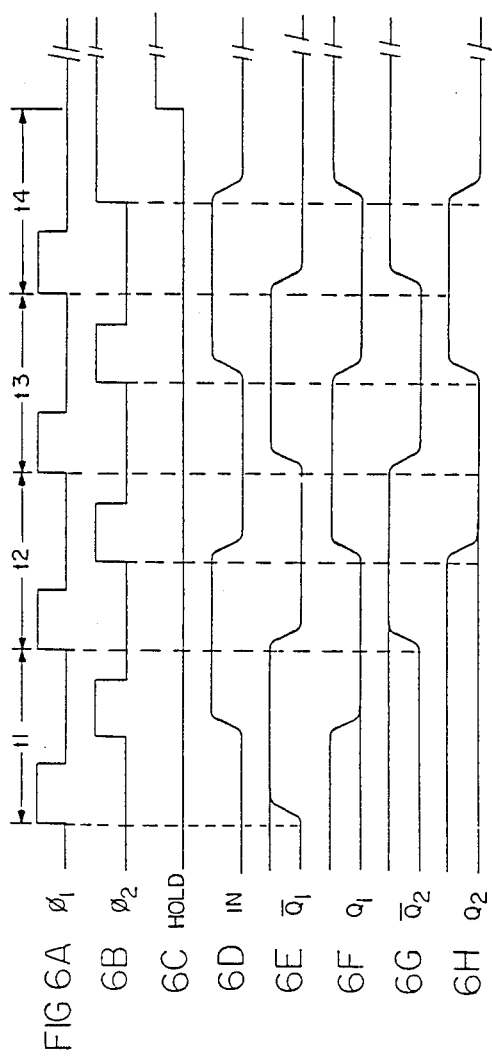
FIGS. 6A through 6H represent wave forms of use in explaining the operation of the structure of FIG. 5.

To configure a logic element such as logic element 40-1 (FIG. 4A), a number of bits must be applied to the configuration control leads such as leads C0 through C5, as shown, for example, in FIG. 2. To do this a shift register, for example, is utilized as part of each configurable logic element. FIG. 5 illustrates a shift register which may be used. The shift register of FIG. 5 is illustrated showing two basic storage cells. Each storage cell is capable of storing one bit of information. Of course, an actual shift register will contain as many storage cells as required to configure the logic element of which the shift register is a part, to its desired configuration. In operation, an input signal is applied to input lead 58. This input signal (shown in FIG. 6D) contains the bit stream to be stored in the shift register as configuration control bits to configure the configurable logic element to perform a desired logic function or to configure (program) an access junction or a general interconnect junction between general interconnect leads in a manner to be described shortly. Thus the sequence of pulses applied to input lead 58 represents those pulses which when stored in the storage cells of the shift register will activate the configuration control bits in the proper manner to achieve the desired functional and/or interconnection result. For example, if the circuit of FIG. 2 is to be configured to form an AND gate, the pulses C0, C1, C2, C3, C4, and C5 would be represented by 1,1,X,X, 0,1.

The sequence of pulses applied to input lead 58 is synchronized with clocking pulses $\phi 1$ and $\phi 2$ applied to leads 57 and 59 respectively. Thus in the first period of operation clocking pulse $\phi 1$ goes high (FIG. 6A), clocking pulse $\phi 2$ is low (FIG. 6B), the hold signal (FIG. 6C) is low during shifting thereby facilitating the passage of data through sequentially connected cells 5-1, 5-2, et al., of the shift register. To shift the pattern 01010 into the shift register, the following operations occur: The input signal on lead 58 is low during approximately the first half cycle of the clocking period t1. The output signal $\overline{Q1}$ of inverter 51-1 goes to a high level in response to the low level input signal and $\phi 1$ high to enable pass transistor 53-1. Some time through the first clocking period t1, the clock signal $\phi 1$ goes low (FIG. 6A) and the clock signal $\phi 2$ shortly thereafter goes high (FIG. 6B) to enable pass transistor 55-1. Consequently, the high level output signal $\overline{Q1}$ is transmitted to the input lead of inverter 52-1 by enabled pass transistor 55-1 and thereby produces a low level output signal Q1 on the output lead of inverter 52-1. Thus at the end of period t1, the output signal Q1 (FIG. 6F) from inverter 52-1 is low level. The output signals $\overline{Q1}$ and Q2 from inverters 51-2 and 52-2 in the second cell are still indeterminate because no known signal has yet propagated to the second storage cell 5-2 to change the signals of these inverters to a known state.

At the beginning of the second period (labeled "t2" in FIG. 6A), $\phi 1$ goes high (FIG. 6A) and $\phi 2$ is low (FIG. 6B) having gone low before period t1 ended. The input signal (FIG. 6D) now has risen to a high level representing a binary 1 and thus the output signal $\overline{Q1}$ of inverter 51-1 has gone low. The output signal Q1 of inverter 52-1 remains low because pass transistor 55-1 is held off by the low level $\phi 2$ signal. Some time through the second period $\phi 1$ goes low followed a fraction of time later by $\phi 2$ going high. At this time, the output signal $\overline{Q1}$ is transmitted through pass transistor 55-1 to inverter 52-1 thereby driving the output signal $\phi 1$ from inverter 52-1 to high level. Meanwhile, during period t2 the previous low level signal on $\phi 1$ has driven the output signal $\overline{Q1}$ of inverter 51-2 to a high level when $\phi 1$ was at a high level to enable pass transistor 53-2 and the change in $\phi 2$ from a low level to a high level in the second half of period t2 to enable pass transistor 55-2 drives the output signal Q2 from inverter 52-2 to a low level. In this manner, the input signal on lead 58 (FIG. 6D) is transmitted through each of the cells 5-1, 5-2, 5-3 et al. in the shift register. Upon the transfer into the shift register of the desired information, the hold signal (FIG. 6C) is enabled (i.e., driven to a high level) thereby to connect the feedback leads 50-1, 50-2, and 50-3 et al. from the output leads of inverters 52 to the input leads of inverters 51 so as to hold the information then in each cell indefinitely. In operation, the signal stored in a given cell e.g. 5-1 is connected to a configuration control or to an interconnect pass device, such as devices 60-1 and 60-2 (FIG. 5).

The output signals $Q_1$, $\overline{Q}_1$, $Q_2$, $\overline{Q}_2$, etc., of the shift register are directly connected to the (configuration) control inputs of a logic element or the pass devices of the general interconnect junctions.

When $\phi 1$ is low, $\phi 2$ and hold may be brought high, thus holding the data indefinitely. The entire shift register may be set or cleared by setting or clearing the input with $\phi 1$ and $\phi 2$ both high and HOLD low. Enough set/reset time must be allowed for the signal to propagate the entire length of the shift register to clear the shift register in this manner. Naturally this time is dependent upon the length of the shift register.

The shift register operates in its dynamic phase by storing the information being shifted as charge on the gates of the transistors (not shown in FIG. 5 but well-known) comprising inverters 51-1, 52-1, 51-2, 52-2 et al. of the shift register. These inverters are of well-known design and will not be described in detail. The use of dynamic shift register is important because a dynamic shift register basic cell uses six transistors and thus takes up very little area. The dynamic shift register is converted to a static latch by adding only one transistor per basic cell. Thus the dynamic shift register (static latch) can be easily fabricated as part of a configurable logic element without adding significant complexity to the circuit or consuming significant semiconductor area. Because of the "hold" signal, the dynamic shift register can become a static latch because placing the shift register on hold automatically refreshes the data. Thus a separate refresh circuit is not needed.

It is apparent from the above description that the dynamic shift register (static latch) circuit does not need refreshing once it has been latched into a hold state. This is accomplished by use of the feedback circuit comprising lead 50-1 and pass transistor 54-1 in cell 5-1, for example.

Figure 7:
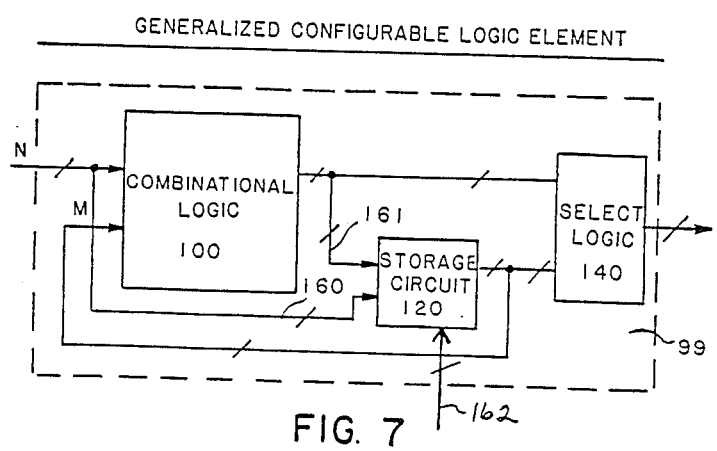
FIG. 7 shows a configurable logic element described in copending U.S. application No. 706,429.

FIG. 7 shows a block diagram of the configurable logic element 99 described in U.S. application, Ser. No. 706,429. The circuitry of element 99 is included in the present invention. The circuitry includes configurable combinational logic 100, configurable storage circuit 120 and configurable output select logic 140. The combinational logic 100 receives the N binary input signals to the configurable logic element 99 and M binary "feedback" signals from storage circuit 120. Combinational logic 100 is configurable into a plurality of configurations. Each configuration implements one or more selected combinational logic functions of one or more selected subsets of the input signals to the combinational logic. Since combinational logic 100 is configurable, it can be employed to implement a variety of different functions. Moreover, two or more selected functions may be implemented simultaneously, appearing on separate output leads of the configurable logic element 100. In more detail, combinational logic 100 selects K binary input signals from among its M+N binary input signals ($K \leq M+N$). Combinational logic circuit 100 is responsive to a plurality of sets of values of a first set of configuration signals including at least a first set of values for which configurable combinational logic 100 implements a first set of functions, each of which is a function of some of said K binary signals, and a second set of values for which configurable combinational logic 100 implements a second set of functions, each of which is a function of some of said K binary signals, where said first set of functions is not the same as said second set of functions. In one embodiment combinational logic 100 has a first configuration which implements a selectable 1 of the $2^{2^K}$ binary valued functions of these K binary signals and a second configuration which implements both a selectable 1 of the $2^{2^{(K-1)}}$ binary valued functions of a first selected $(K-1)$ of the K selected binary input signals and a selectable 1 of the $2^{2^{(K-1)}}$ binary value functions of a second selected $(K-1)$ of the K selected binary input signals. (The second set of K−1 signals need not be distinct from the first set.) The operation of combinational logic 100 will be more readily understood after a consideration of the specific embodiment described in FIG. 8 which is explained hereafter.

Storage circuit 120 is also configurable and may be programmed to implement, depending on the configuration, one or more storage elements each of which may be, for example, a transparent latch with set and reset, a D flip-flop with set and reset, an edge detector, a stage of a shift register, or a stage of a counter. Configurable storage circuit 120 receives the output signals of combinational logic 100 on bus 161 as well as storage element control signals on bus 162 and selected ones of the N input signals of combinational logic 100 on input bus 160. Output select logic 140 is configured to provide output signals which are selected from among the output signals of the combinational logic element and the storage circuit.

Figure 8:
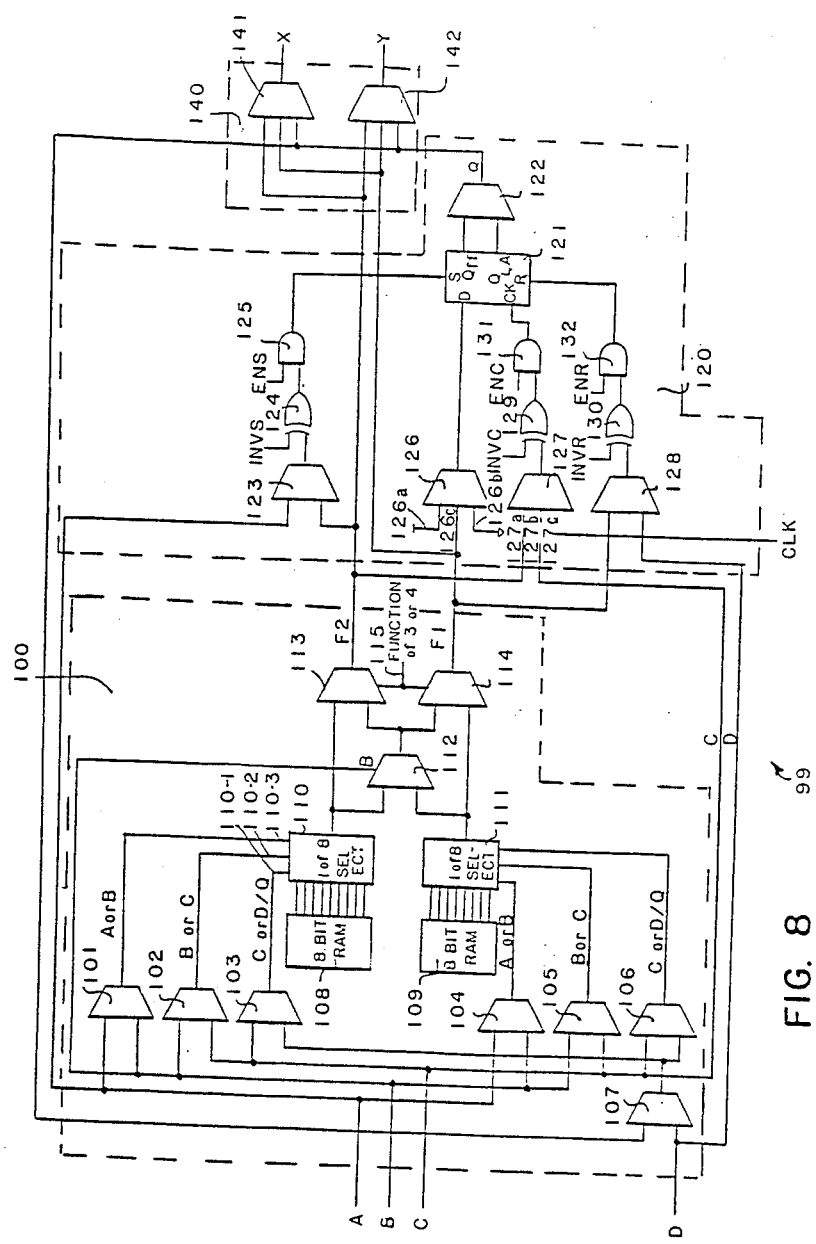
FIG. 8 shows one embodiment of the configurable logic element of FIG. 7.

FIG. 8 shows the details of one embodiment of the configurable logic element 99 in FIG. 7. In FIG. 8, the four input signals to the configurable logic element 99 are denoted by A, B, C, D (i.e., N=4). Since the storage circuit 120 provides only a single feedback signal Q to switch 107, M=1. In FIG. 8, K=4 since the signals A, B, C and either D or Q are selected from among the five signals A, B, C, D, and Q. Configurable combinational logic element 100 includes configurable switches 101 through 107, 113, and 114 8-bit RAMs 108 and 109, one of eight select logics 110 and 111, multiplexer 112, and configuration control lead 115 to switches 113 and 114. Each of the configurable switches is configured by control bits from a programming register (not shown) on leads (not shown except for lead 115) as previously explained. Switch 101 may be configured to provide signal A as its output signal or it may be configured to provide signal B as its output signal. Similarly, each of the switches 102 through 107 may be configured to provide a selected 1 of its two input signals as its output signal. Thus, for example, for one selection of configuration control bits, switch 107 provides signal D and the binary signals A, C, and D are provided to both one of eight select logic 110 and one of eight select logic 111 by switches 101 through 103 and 104 through 106, respectively. For each of the eight possible combinations of binary signals A, C and D, select logic 110 selects a unique storage element in RAM 108 and outputs the bit stored in the selected location. One of eight select logic 111 operates similarly with respect to 8-bit RAM 109. Multiplexer 112 provides either the output signal from select logic 110 or the output signal from select logic 111, depending on the state of signal B. For this configuration, the control bit applied on lead 115 causes switches 113 and 114 to simultaneously pass the output signal from multiplexer 112 to output leads F1 and F2 of combinational logic element 100. The two 8-bit RAMs 108 and 109 can be programmed with binary bits in $2^{16}$ different ways. Each choice of programming of the 8-bit RAMs causes the combinational logic of element 100 to implement one of the $2^{16}=2^{24}$ possible logic functions of the four binary variables A, B, C and D. (Here K=4.) (A logic function is a binary valued function of binary variables.)

For another selection of configuration control bits, switch 107 provides feedback signal Q from storage circuit 120 and switches 101 through 103 and 104 through 106 and 113 and 114 are configured as before. Then the combinational logic element 100 implements one of the $2^{16}=2^{24}$ possible logic functions of the four binary variables A, B, C and Q for each choice of programming of the two 8 bit rams 108 and 109. (Here again K=4.)

For another selection of configuration control bits, switch 101 through 103 provide signals A, C and Q, and switches 104 through 106 provide signals B, C, and Q, respectively, and the control signal applied to lead 115 causes switches 113 and 114 to provide the output signal of select 110 on lead F2 and the output signal of select 111 on lead F1, respectively. Thus, this configuration implements on lead F1 one of the $2^8 = 2^{2^3}$ logic functions of the three binary variables A, C, and Q for each of the $2^8$ possible programmings of 8-bit RAM 108 and on lead F2 implements one of the $2^8$ logic functions of the three binary variables B, C and Q for each of the $2^8 = 2^{2^3}$ possible programmings of RAM 109.

In general, for any first selection of three of the four variables A, B, C and D/Q, and for any second selection of three of the four variables A, B, C and D/Q, there is a configuration of the combinational logic element 100 which implements one of the $2^{2^3}$ logic functions of the first selection of three variables on output lead F2 for each of the $2^8$ possible programmings of 8-bit RAM 108 and one of the $2^{2^3}$ logic functions of the second selection of three variables on output lead F1 for each of the $2^8$ possible programmings of RAM 109.

In another embodiment (not shown), each of the 8-bit RAMs may be "subdivided" by providing each with two additional one of four select logic so that any four binary functions of two of the variables A, B, C and D/Q are implemented on four additional output leads of the combinational logic element 100. Similarly, in another embodiment (not shown) a 32 bit RAM and the signals A, B, C, and D and the feedback signal Q are all used (so that K=5) to implement in one configuration one of the $2^{2^5}$ binary functions corresponding to each programming of the 32 bit RAM (here N=4, M=1, and K=5) In another configuration (not shown) N=4, M=1, K=5, and a first binary function F1 of the variables A, B, C, a second binary function F2 of the variables B, C, D and a third binary function F3 of the variables B, C, D, Q are, implemented. It is important to observe that $2^{K'1} + 2^{K'2} + 2^{K'3} = 2^K$ where $K'_i$ is the number of variables of which $F_i$ is a function for i=1, 2, 3. Returning to FIG. 8, it is also important to observe that configurable switches 101, 102 and 103 select a subset of their input signals and provide the selected subset of input signals on a one-to-one basis to selected input leads of circuit 110. For example, in response to one set of values of configuration signals, configurable switches 101, 102 and 103 provide signal A to lead 110-3, signal B to lead 110-2, and signal C to lead 110-1.

The output signals on leads F1 and F2 are input signals to configurable storage circuit 120. Signals A, C, and D are also input signals to storage circuit 120, along with clock signal CLK. Configurable storage circuit 120 includes programmable switches 122, 123, 126, 127 and 128, exclusive OR gates 124, 129 and 130, AND gates 125, 131 and 132, and storage element 121. Storage element 121 has set, reset, data and clock input leads denoted by S, R, D and Ck, respectively, and output leads $Q_{FF}$ and $Q_{LA}$.

Switches 123, 126, 127 and 128 are each configured to select one of their input signals as an output signal. The set, clock, and reset functions associated with the set, clock, and reset input leads of storage element 121 are all active high but each may be rendered active low relative to the output signal of switches 123, 127, and 129 respectively by applying a logical 1 to the leads INVS, INVC, and INVR of exclusive-OR gates 124, 129, and 130 respectively. (If a logical 0 is applied to leads INVS, INVC, and INVR, the polarity of the output signals of the exclusive-OR gates 124, 129, and 130 is the same as that of the input signals. If a logical 1 is applied to leads INVS, INVC, and INVR, the output signals of exclusive-OR gates 124, 129, and 130 are the inverse of the input signals.)

The AND gates 125, 131, and 132 are enabled by applying a logical 1 to the input leads ENS, ENC, and ENR respectively (and disabled by applying a logical 0). If a logical 0 is applied to one of the input leads ENS, ENC, or ENR, the output of the AND gate is a logical 0 and the associated function of memory circuit 121 is disabled regardless of the state of the corresponding exclusive OR gate. $Q_{FF}$ provides a flip-flop output signal an $Q_{LA}$ provides a latch output signal as explained later in conjunction with FIG. 9. Configurable switch 122 selects one of the binary singals on leads $Q_{FF}$ and $Q_{LA}$ and the output signal Q of switch 122 is an input signal to the output select logic 140 and to the configurable combinational logic 100.

Figure 9:
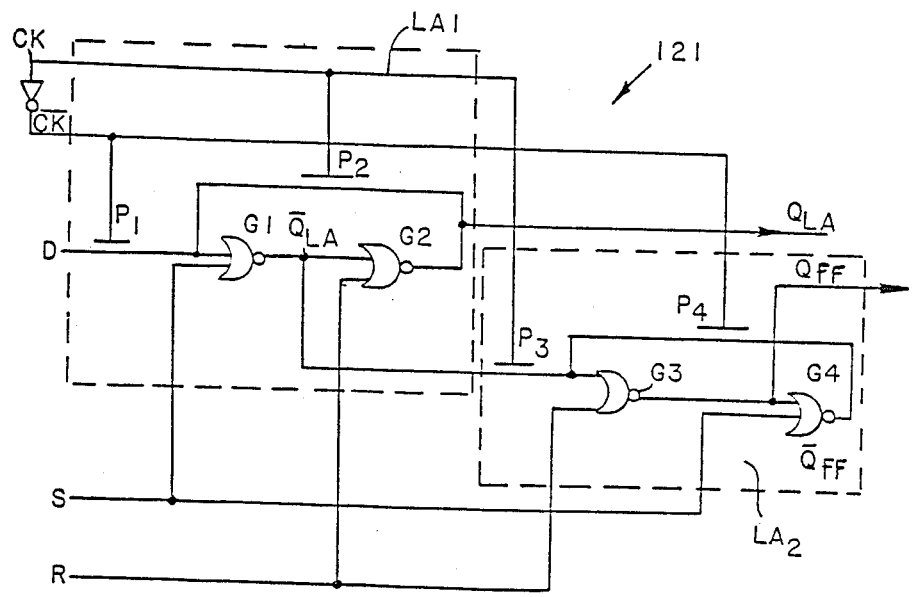
FIG. 9 shows one embodiment of the storage element 121 of FIG. 8.

FIG. 9 shows one embodiment of memory circuit 121. Memory element 121 comprises two "D" latches LA1 and LA2 connected in series thereby implementing a flip-flop. Latch LA1 includes N channel pass transistors P1 and P2 and NOR gates G1 and G2. The gates of pass transistors $P_1$ and $P_2$ are controlled by the signals $\overline{CK}$ and CK, respectively. Similarly, latch LA2 includes N channel pass transistors P3 and P4 and NOR gates G3 and G4. The gates of transistors P3 and P4 are controlled by the signals CK and $\overline{CK}$, respectively. The D input lead is the data input lead of latch LA1. The S input lead serves as the set input lead of latch LA1 and as the reset input lead of latch LA2. The R input lead serves as the reset input lead of latch LA1 and as the set input lead of latch LA2.

The output signal $\overline{QHD}$ LA of NOR gate G1 is connected to the data input lead of latch LA2. The output lead $Q_{LA}$ is connected to the output lead of NOR gate G2 of latch LA1 and the output lead $Q_{FF}$ is connected to the output lead of NOR gate G3 of latch LA2.

Configurable storage circuit 120 (FIG. 8) operates as a transparent latch with set and reset by configuring switch 122 to connect output lead Q to output lead $Q_{LA}$. The output signal on lead $Q_{LA}$ follows the input signal while the clock signal CK is low. The output signal on $Q_{LA}$ is held when the clock signal CK goes high, turning off pass transistor $p_1$ and turning on pass transistor $P_2$.

Storage circuit 120 may also be configured to operate as a D flip-flop with set and reset. In this configuration, switch 126 is configured to select the signal on lead $F_1$ and gates 125, 131 and 132 are enabled by applying a logical 1 to leads ENS, ENC, and ENR, respectively. Finally, switch 122 is configured to select the output signal on lead $Q_{FF}$ of storage element 121. Storage element 120 may also be configured as a D flip-flop without set and reset by modifying the above configuration by applying a logical zero to leads ENS and ENR.

Configurable storage circuit 120 may also be configured to be an SR latch by enabling AND gates 125 and 132, and disabling AND gate 131 so that a logical 0 input signal is provided on the Ck input lead of storage element 121. The logical 0 on lead Ck turns off pass transistor P3 and turns on pass transistor P4. Switch 122 is then configured to select the output signal on $Q_{FF}$.

Finally, storage circuit 120 may also be configured to be an edge detector. For example, to configure storage element 120 as a rising edge detector, AND gate 125 is disabled to provide a logical 0 on input lead S, AND gate 131 is enabled to pass a clock signal to input lead, CK, and switch 126 is configured to select input lead 126a so that a logical 1 is provided to input lead D. AND gate 132 is enabled. A logical 1 reset signal forces the output signal on $Q_{FF}$ to a logical 0. A low clock signal turns off pass transistor P2 and P3 and turns on pass transistor P1, permitting NOR gate G1 to invert the logical 1 on lead D, thus providing a logical 0 on node $\overline{Q}_{LA}$. When the olock siqnal rises, transistors P1 and P4 are turned off, transistors P2 and P3 are turned on, and the logical 0 on node $\overline{Q}HD$ LA is inverted by NOR gate G3, thus providing a logical 1 on output lead $Q_{FF}$ which signals that a rising edge has been detected. $Q_{FF}$ is then reset to 0 using the reset input, and the edge detector is then ready to detect the next rising edge. (Note that when the clock signal falls, transistors P2 and P3 are turned off and transistor P4 is turned on, and the signal on $Q_{FF}$ remains a logical 0 and does not change state until the next rising edge.)

Similarly, storage circuit 120 may be configured as a falling edge detector by applying a logical one signal to lead INVC of exclusive-or gate 129. Clearly, storage circuit 120 may also serve as a stage of a shift register or a stage of a counter.

The output select logic 140 includes configurable switches 141 and 142 which are each configured to select an output signal from among the output signals on leads F1 and F2 from the combinational logic 100 and the output signal of storage element 120.

Configurable logic circuit 99 shown in FIG. 8 is not adapted for ease of communication with a microprocessor. For example, if it is desired to write data from a microprocessor by storing the data in storage element 121, storage element 121 is then not available to receive other output signals from combinational logic element 100. Further, communication between the microprocessor and a configurable logic array containing a plurality of configurable logic elements, each identical to configurable logic element 99, would require the use of the general interconnect structure, reducing the versatility of the logic array.

Figure 10:
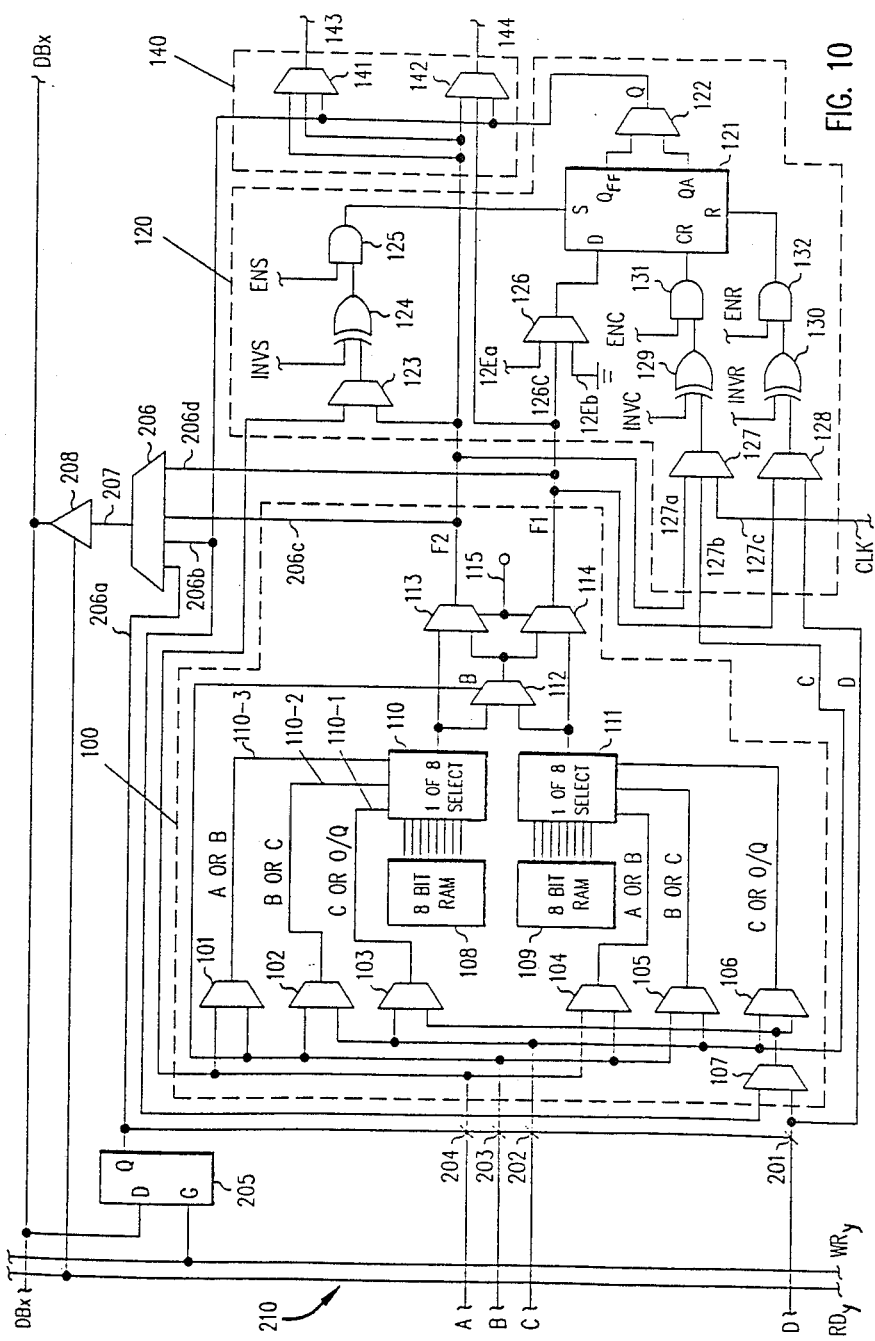
FIG. 10 shows one embodiment of the microprocessor oriented configurable logic element of the present invention.

FIG. 10 shows the configurable logic element 210 of the present invention which is a microprocessor oriented version of CLE 99 shown in FIG. 8. CLE 210 includes all of the circuitry shown in FIG. 8 together with latch 205, programmable switches 201, 202, 203, 204, 206 and three-state buffer 208.

Information is stored in latch 205 by placing a write signal on lead $WR_Y$ connected to input lead G of latch 205 while simultaneously transmitting the signal to be stored to input lead D via bidirectional data lead $DB_x$. The Q output lead of latch 205 can be connected, if desired, to any one of the input leads A, B, C, or D by appropriately configuring (programming) configurable switches 201, 202, 203, and 204. These connections are accomplished using pass transistors as illustrated in connection with FIG. 2 or similar switching elements as is well known in the art. For example, switch 202 may be configured to connect output lead Q to input lead C. In general, switches 201 through 204 are configured by control bits in a programming register (not shown) connected to the configurable switches by leads (not shown for the sake of clarity).

Similarly, switch 206 is configured by control bits in a programming register (not shown) connected to configurable switch 206 by leads (not shown). Switch 206 may be configured to connect any selected one of leads 206a, 206b, 206c or 206d to output lead 207. Thus switch 206 provides as an output signal on lead 207, the signal stored in latch 205, one of the output signals of the configurable combinational logic 100 or one of the signals stored in storage circuit 121. The particular one of these signals to be provided by switch 206 is determined by the user.

The read signal on lead RD enables three-state buffer 208. When enabled, three-state buffer 208 provides the signal on its input lead 207 to bidirectional data lead $DB_x$. When not enabled, three-state buffer 208 output is in a high impedance state. The state of three-state buffer 208 is controlled by the level of the signal on $RD_y$ in a well known manner. Thus by configuring latch 206 and enabling three-state buffer 208, the user may check (read) the status of a selected important internal signal of CLE 210, for example, the status of one of the output signals of combinational logic 100, the status of the output signal of storage circuit 121, or the status of the signal stored in latch 205.

Figure 11:
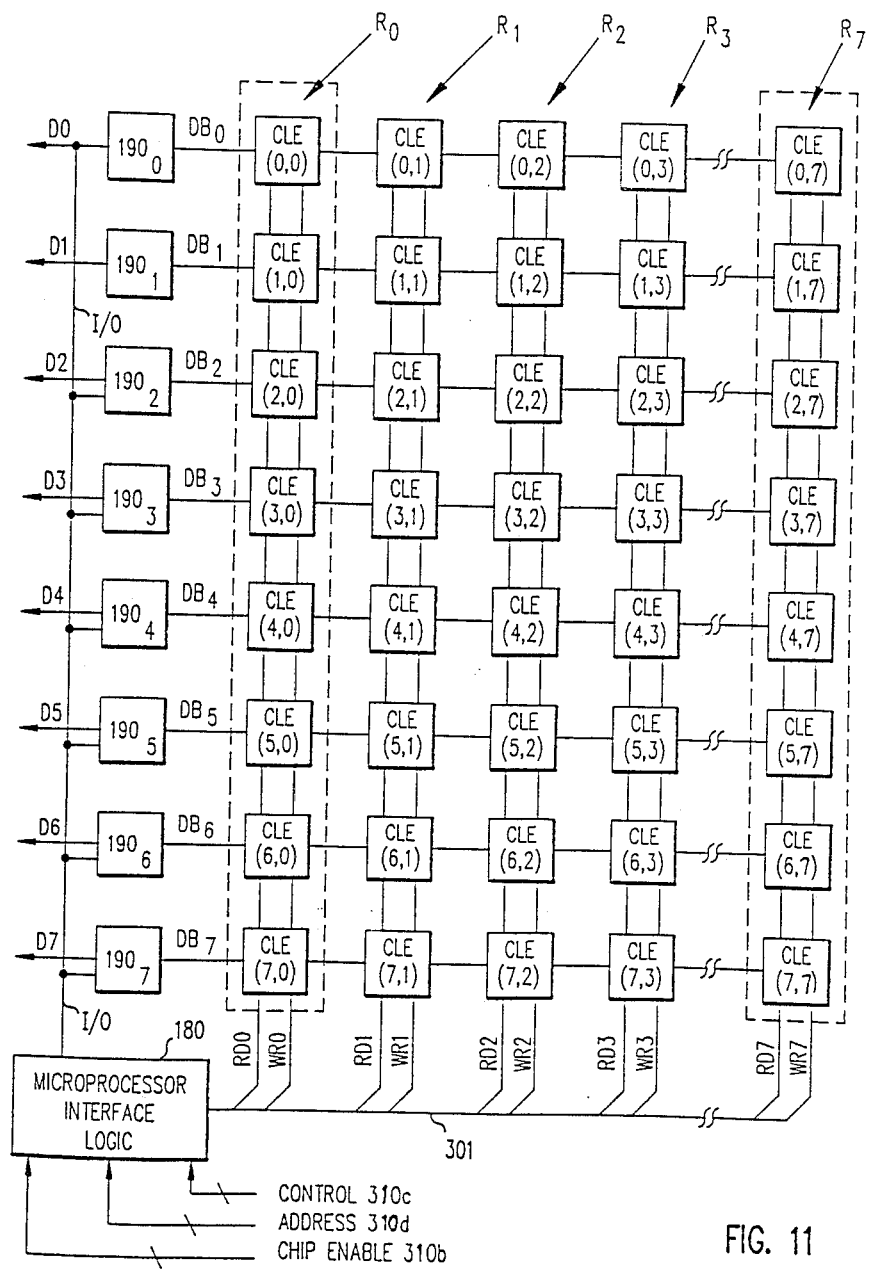
FIG. 11 shows a chip employing an array of the microprocessor oriented configurable logic elements shown in FIG. 10.

FIG. 11 shows a chip 300 with an 8×8 array of CLEs, namely, CLE(x,y), x, y =0, . . . , 7, each CLE being the same as CLE 210 (FIG. 10). (In another embodiment (not shown), only selected CLEs in the array shown in FIG. 11 are identical to CLE 210, the remaining CLEs being as shown in FIG. 8). A microprocessor interface structure 180 produces read and write signals which activate each register $R_0$ through $R_7$. Register $R_y$ contains 8 configurable logic elements, namely, CLE(x, y), x =0, . . . , 7. Although each CLE is identical to CLE 210, each configurable logic element can be configured to provide a different output signal on leads 143 and 144 shown in FIG. 10. The output leads from the configurable logic elements and the general interconnect structure are not shown in FIG. 11 for the sake of clarity.

The microprocessor oriented configurable logic array shown in FIG. 11 has great flexibility by making it possible for the user to write data to each CLE from a microprocessor and to monitor selected internal signals of each CLE in array 300 while leaving storage element 121 free for other uses and without using any of the general interconnect structure (not shown in FIG. 11) of CLA 300. Also, none of the logic provided by the CLEs in the array is used to implement the microprocessor interface logic 180.

Microprocessor interface logic 180 has three kinds of input busses, bus 310a for receiving address signals, bus 310b for receiving the chip enable signals, and bus 310c for receiving control signals. The output signals of microprocessor interface logic 180 are read and write signals transmitted on bus 301 whose dimension depends on the number of registers employed. In this case, bus 301 contains 8 read and 8 write leads.

The microprocessor interface logic 180 and blocks 190° through 190₇, which contain a bidirectional buffer for each data line $DB_0$ through $DB_7$ respectively, is shown in more detail in FIG. 12. In this example, address bus 310a provides a 3-bit address to microprocessor interface logic 180 which generates a signal which selects the particular register $R_y$ to be read from or written to in FIG. 11. Lead 310b provides a chip enable signal to microprocessor interface logic 180. Control bus 310c includes read and write leads and $\overline{RD}$ and $\overline{WR}$ shown in FIG. 12. Read and write signals $\overline{RD}$ and $\overline{WR}$ on leads $\overline{RD}$ and $\overline{WR}$ generate an input-output signal on lead I/O that determines the state of three-state buffers 1900-1907. For a first selected signal on lead I/O signals are conducted from microprocessor 310 through buffers 190$a_0$-190$a_7$ to data leads DB$_0$-DB$_7$ shown in FIG. 11. For a second selected signal level on lead I/O, data signals are conducted from bus DBo through DB$_o$ through DB$_7$ to microprocessor 310 via buffers 190B$_0$-190B$_7$.

Figure 14:
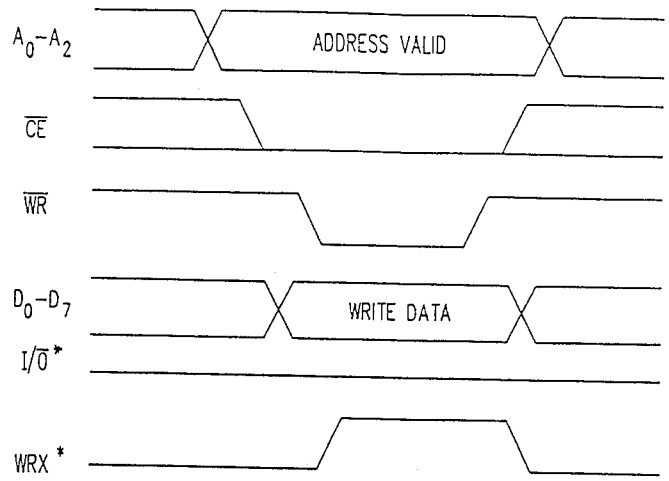
FIG. 14 shows write cycle timing for circuit 300 shown in FIG. 11.

FIGS. 13 and 14 provide an example of read cycle and write cycle timing diagrams for chip 300.

Figure 15:
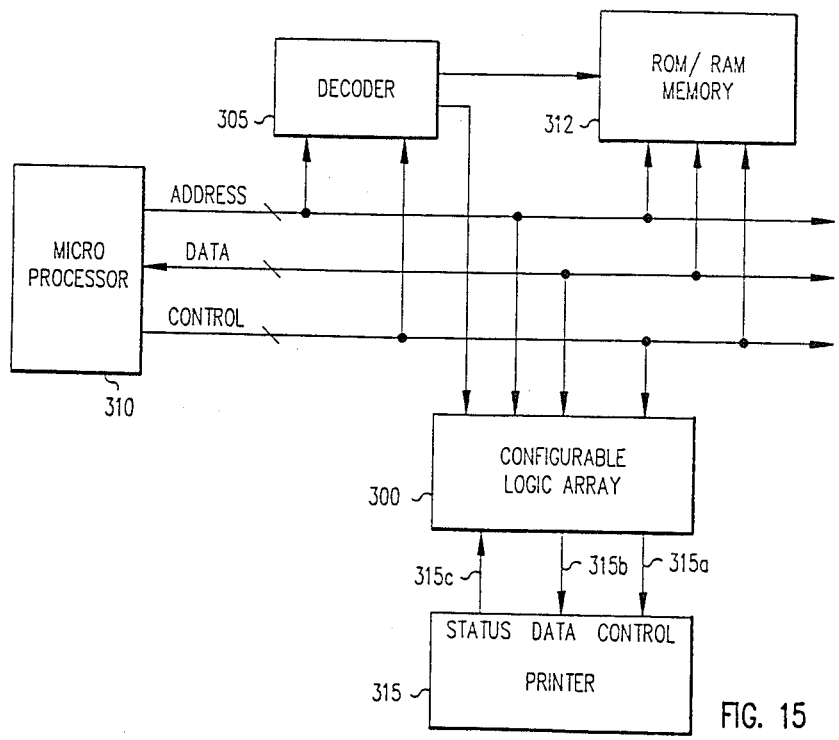
FIG. 15 shows a system employing the chip of FIG. 11 in combination with a microprocessor and memory.

FIG. 15 illustrates a system employing the microprocessor oriented configurable logic array chip 300 shown in FIG. 11. The part of the system shown in FIG. 15 is composed of microprocessor 310, RAM/ROM memory 312, decoder 305, and printer 315 in addition to configurable logic array 300. In this example, configurable logic array 300 is used to interface microprocessor 310 to printer 315. The configurable logic array in such a system replaces small scale integration (SSI), medium scale integration (MSI), and/or large scale integration (LSI) circuitry commonly employed. The microprocessor executes a program stored in ROM/RAM memory 312. Configurable logic array 300 interprets commands received from microprocessor 310 on the DATA bus and in response generates the proper printer control signals which are transmitted to the printer on leads 315A via I/O pins (not shown in FIGS. 11 and 15) similar to the I/O pads shown in FIG. 4A. Configurable logic array 300 also receives the data to be printed from microprocessor 310 on the DATA bus, modifies the data format to be compatible with the printer, if necessary, and transfers the data to the printer via, leads 315b. Status signals generated by printer 315 are received by configurable logic array 300 on leads 315c. The state of these status signals can be transferred to microprocessor 310 via the DATA bus when it reads the appropriate register inside configurable logic array 300.

The above embodiments are intended to be exemplary and not limiting. It will be obvious in view of the disclosures made above that various substitutions and modifications may be made without departing from the scope of the invention.

In the claims which follow, the phrase "means having a configuration in which said means" performs a particular function is used in place of the detailed wording "means which are capable of being configured in response to a selected set of values of a set of configuration signals and which, when configured by said selected set of values," performs a particular function.

I claim:

1. A configurable logic element comprising:
   means for receiving a first plurality of N binary input signals;
   means for receiving a second plurality of M binary feedback signals;
   means for selecting K of said M+N binary signals (where K≦M+N);
   configurable combinational logic means for receiving said K binary signals from said means for selecting, said configurable combinational logic means having a plurality of configurations for generating selected binary output signals;
   a first configurable storage circuit for receiving selected ones of said binary output signals of said configurable combinational logic means and selected ones of said N binary input signals and for generating said M binary feedback signals, said configurable storage circuit having a plurality of configurations;
   a configurable select logic comprising means for receiving said output signals generated by said combinational logic means and said M binary signals generated by said configurable storage circuit and means for selecting output signals from among the signals received by said select logic; and
   means for reading the status of a selected one of said output signals of said combinational logic means and said M feedback signals.

2. A configurable logic element as in claim 1 further including:
   a second storage circuit for storing a data signal and for providing an output signal representing said stored data signal; and
   configurable means for receiving said output signal of said second storage circuit and providing said output signal of said second storage circuit to said means for receiving a first plurality of N binary input signals, said output signal of said second storage circuit being one of said N binary input signals.

3. A configurable logic element as in claim 2 wherein said means for reading the status further includes means for reading the status of said output signal of said second storage circuit.

4. A configurable logic element as in claim 1 wherein said means for reading the status comprises:
   a configurable switch for receiving said output signals of said combinational logic circuit and said M binary feedback signals, said configurable switch having a plurality of configurations, said configurable switch providing in each configuration a signal representing a different one of the signals received by said configurable switch; and
   a three-state buffer for receiving the signal provided by said configurable storage circuit and for providing an output signal representing the signal received by said three-state buffer when said three-state buffer is enabled.

5. A configurable logic element comprising:
   means for receiving a first plurality of N binary input signals;
   means for receiving a second plurality of M binary feedback signals;
   means for selecting K of said M+N binary signals (where K≦M+N);
   configurable combinational logic means for receiving said K binary signals from said means for selecting, said configurable combinational logic means having a plurality of configurations for generating selected binary output signals;
   a first configurable storage circuit for receiving selected ones of said binary output signals of said configurable combinational logic means and selected ones of said N binary input signals and for generating said M binary feedback signals, said configurable storage circuit having a plurality of configurations;
   a configurable select logic comprising means for receiving said output signals generated by said combinational logic means and said M binary signals generated by said configurable storage circuit and means for selecting output signals from among the signals received by said select logic;

a second storage circuit for storing a storage data signal and for providing an output signal representing said storage data signal; and configurable means for providing said output signal of said second storage circuit to said means for receiving a first plurality of N binary input signals.

6. A configurable logic array comprising:

a plurality of configurable logic elements, each of said configurable logic elements being as in claim 5; and means for selectively communicating data signals from a data bus to each of said second storage circuits.

7. A configurable logic array as in claim 6 wherein said means for selectively communicating data signals includes a microprocessor interface circuit for receiving address signals and control signals from said microprocessor and for generating write signals which determine which of said second storage elements store a data signal.

8. A configurable logic array as in claim 7 wherein said plurality of configurable logic elements are arranged in a rectangular configuration of rows and columns.

9. A configurable logic array comprising:

a plurality of configurable logic elements each of said configurable logic elements being as in claim 1; and means for selecting particular ones of said means for reading the status and for providing the signal read by said particular ones of said means for reading to a data bus.

10. A configurable logic array as in claim 9 wherein said means for selecting includes a computer interface logic.

11. A configurable logic array comprising:

a plurality of configurable logic elements, each of said logic elements being as in claim 2, a buffer having a first state for receiving a selected signal read by one of said means for reading the status and for providing said selected signal to a microprocessor, and a second state for providing a data signal from said microprocessor to one of said second storage circuits.

* * * * *

UNITED STATES PATENT AND TRADEMARK OFFICE
CERTIFICATE OF CORRECTION

PATENT NO. : 4,758,985

DATED : July 19, 1988

INVENTOR(S) : William S. Carter

It is certified that error appears in the above-identified patent and that said Letters Patent is hereby corrected as shown below:

Col. 4, line 58, "C0, $\overline{C0}$C1, $\overline{C1}$, . . ." should read --C0, $\overline{C0}$, C1, $\overline{C1}$, . . . --.

Col. 6, line 11, "A, B, A$\overline{C}$, and $\overline{D}$" should read --A, B, C, D--.

Col. 6, line 13, ""15'"" should read --"15"--.

Col. 6, line 25, "junctions form the" should read --junctions for the--.

Col. 8, line 23, "$\overline{Q1}$ and Q2" should read --$\overline{Q2}$ and Q2--.

Col. 8, line 39, "output signal $\emptyset$1" should read --output signal Q1--.

Col. 8, line 41, "signal on $\emptyset$1" should read --signal on Q1--.

Col. 8, line 42, "signal $\overline{Q1}$ of inverter" should read --signal $\overline{Q2}$ of inverter--.

Col. 9, line 48, "(K$\leq$M+N)." should read -- (K$\leq$M+N).--.

Col. 9, line 60, "the $2^{2K}$binary" should read --the $2^{2^K}$ binary--.

UNITED STATES PATENT AND TRADEMARK OFFICE
CERTIFICATE OF CORRECTION

PATENT NO. : 4,758,985
DATED : July 19, 1988
INVENTOR(S) : William S. Carter

Page 2 of 3

It is certified that error appears in the above-identified patent and that said Letters Patent is hereby corrected as shown below:

Col. 9, lines 62-63, "binary valued functions of a first *selected* (italicized) should read --binary valued functions of a first selected--.

Col. 9, line 64, "$2^{2(K-1)}$" should read --$2^{2^{(K-1)}}$--.

Col. 11, line 13, "one of the 28 logic" should read --one of the $2^8$ logic--.

Col. 11, line 15, "$2^8=2^{23}$" should read --$2^8=2^{2^3}$--.

Col. 11, line 20, "$2^{23}$ logic" should read --$2^{2^3}$ logic--.

Col. 11, line 23, "the $2^{23}$ logic" should read --the $2^{2^3}$ logic--.

Col. 11, line 35, "$2^{25}$" should read --$2^{2^5}$--.

Col. 11, line 42, "$2^K 1 + 2^K 2 + 2^K 3$" should read --$2^{K_1'} + 2^{K_2'} + 2^{K_3'}$--.

Col. 12, line 38, "signal $\overline{QHD}$ LA" should read --signal $\overline{Q}_{LA}$--.

Col. 12, line 50, "transistor $p_1$" should read --transistor $P_1$--.

UNITED STATES PATENT AND TRADEMARK OFFICE
CERTIFICATE OF CORRECTION

PATENT NO. : 4,758,985
DATED : July 19, 1988
INVENTOR(S) : William S. Carter

It is certified that error appears in the above-identified patent and that said Letters Patent is hereby corrected as shown below:

Col. 13, line 13, "olock" should read --clock--.

Col. 13, line 15, "$\overline{Q}$HD LA" should read --$\overline{Q}_{LA}$--.

Col. 14, line 12, "RD" should read --$RD_y$--.

Col. 14, line 60, "190●" should read --$190_0$--.

Col. 15, line 4, "1900-1907" should read --$190_0$-$190_7$--.

Col. 15, lines 8 and 9, "DBo through $DB_0$ through $DB_7$" should read --$DB_0$-$DB_7$--.

Col. 15, line 10, "$190B_0$-$190B_7$." should read --$190b_0$-$190b_7$.--.

Signed and Sealed this

Twenty-eighth Day of March, 1989

Attest:

DONALD J. QUIGG

*Attesting Officer*   Commissioner of Patents and Trademarks